(12) United States Patent
Horzel et al.

(10) Patent No.: US 6,552,414 B1
(45) Date of Patent: Apr. 22, 2003

(54) SEMICONDUCTOR DEVICE WITH SELECTIVELY DIFFUSED REGIONS

(75) Inventors: Jörg Horzel, Leuven (BE); Jozef Szlufcik, Kessel-lo (BE); Mia Honoré, Kortenberg (BE); Johan Nijs, Linden-Lubbeek (BE)

(73) Assignee: IMEC vzw (BE)

( * ) Notice: Subject to any disclaimer, the term of this patent is extended or adjusted under 35 U.S.C. 154(b) by 0 days.

(21) Appl. No.: 09/331,932

(22) PCT Filed: Dec. 22, 1997

(86) PCT No.: PCT/EP97/07246

§ 371 (c)(1),
(2), (4) Date: Aug. 27, 1999

(87) PCT Pub. No.: WO98/28798

PCT Pub. Date: Jul. 2, 1998

Related U.S. Application Data (60) Provisional application No. 60/044,596, filed on Apr. 22, 1997.

(30) Foreign Application Priority Data

Dec. 24, 1996 (EP) .............................. 96120865

(51) Int. Cl.[7] ............................................. H01L 29/167

(52) U.S. Cl. ....................... 257/655; 257/437; 257/461; 257/462; 257/463; 257/607; 257/608; 257/609; 257/610; 257/611; 257/612; 257/655; 257/186; 257/191

(58) Field of Search ................................ 257/607, 608, 257/609, 610, 611, 612, 437, 461, 462, 463

(56) References Cited

U.S. PATENT DOCUMENTS 2,999,240 A    9/1961   Nicoll
4,001,864 A *  1/1977   Gibbons ....................... 357/30
4,104,091 A    8/1978   Evans, Jr. et al.

(List continued on next page.)

FOREIGN PATENT DOCUMENTS

| DE | 42 17 428 A 1 | 6/1993 |
| DE | 44 01 782 A 1 | 7/1995 |
| EP | 0 680 099 A3 | 11/1995 |
| GB | 1470241 A | 4/1977 |

OTHER PUBLICATIONS

"Simple Integral Screenprinting Process for Selective Emitter Polycrystalline Silicon Solar Cells", Szlufcik, et al., *American Institute of Physics*, 1991, pp. 1583–1584.

"Integration of Screen–Printing and Rapid Thermal Processing Technologies for Silicon Solar Cell Fabrication", Doshi, et al., *IEEE Electron Device Letters*, vol. 17, No. 8, Aug., 1996.

Primary Examiner—Jerome Jackson
Assistant Examiner—Edgardo Ortiz
(74) Attorney, Agent, or Firm—Knobbe, Martens, Olson & Bear, LLP (57) ABSTRACT

The present invention describes a method of manufacturing a semiconductor device, comprising a semiconductor substrate (2) in the shape of a slice, the method comprising the steps of: step 1) selectively applying a pattern of a solids-based dopant source to a first major surface of said semi-conducting substrate (2); step 2) diffusing the dopant atoms from said solids-based dopant source into said substrate (2) by a controlled heat treatment step in a gaseous environment surrounding said semi-conducting substrate (2), the dopant from said solids-based dopant source diffusing directly into said substrate (2) to form a first diffusion region (12) and, at the time, diffusing said dopant from said solids-based dopant source indirectly via said gaseous environment into said substrate (2) to form a second diffusion region (15) in at least some areas of said substrate (2) not covered by said pattern; and step 3) forming a metal contact pattern (20) substantially in alignment with said first diffusion region (12) without having etched said second diffusion region (15) substantially.

13 Claims, 6 Drawing Sheets

U.S. PATENT DOCUMENTS

| | | | |
|---|---|---|---|
| 4,133,698 A | | 1/1979 | Chiang et al. |
| 4,142,200 A | * | 2/1979 | Mizushima et al. .......... 357/30 |
| 4,152,824 A | | 5/1979 | Gonsiorawski |
| 4,156,622 A | * | 5/1979 | Lindmayer ................... 136/89 |
| 4,201,798 A | * | 5/1980 | Lindmayer ................... 427/74 |
| 4,377,901 A | | 3/1983 | David et al. |
| 4,478,879 A | | 10/1984 | Baraona et al. |
| 6,096,968 A | * | 8/2000 | Schlosser et al. ........... 136/256 |
| 6,163,673 A | * | 10/2000 | Frei et al. ................... 438/545 |
| 6,146,483 A | * | 11/2000 | Hanoka et al. ............. 156/182 |
| 6,206,996 B1 | * | 3/2001 | Hanoka et al. ............. 156/230 |
| 6,278,053 B1 | * | 8/2001 | Hanoka et al. ............. 136/256 |

* cited by examiner

SEMICONDUCTOR DEVICE WITH SELECTIVELY DIFFUSED REGIONS

This application claims the benefit of Provisional application Ser. No. 60/044,596, filed Apr. 22, 1997.

FIELD OF THE INVENTION

The present invention relates to a semiconductng device and a method for the manufacture thereof, in particular to a photovoltaic cell having two or more selectively diffused regions produced in a single diffusion step.

TECHNICAL BACKGROUND

Figure 1:
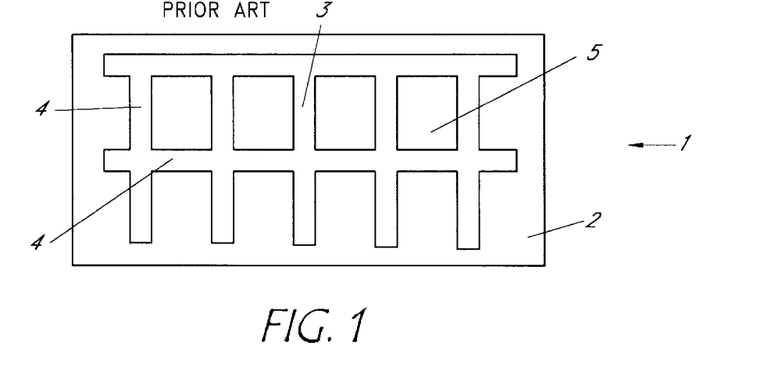
FIG. 1 shows a schematic top view of a known semiconductor device.

Many semiconductor devices make use of differently doped regions of the same conductivity type (p or n) to achieve better performance of the device. The formation of these differently doped regions often implies additional process steps that increase the cost of production. A typical semiconductor device 1 is shown in top-view in FIG. 1, which may be a photovoltaic cell, sometimes called a solar cell. A semiconductor substrate 2 of a first doping type has doped surface regions 5, typically of a second doping type, and a metallisation pattern 3 on at least one major surface. The metallisation pattern 3 usually includes elongate metal electrodes 4 between and under which are doped regions 5, e.g. emitter, collector or gate regions. The electrodes 4 may form ohmic contacts to heavily doped regions 6 (shown best in FIGS. 3 and 4) of the underlying substrate 2. Electrodes 4 collect from, or supply electric currents to the regions 5, which may include semiconductor devices. For a solar cell, region 5 is usually the emitter region.

Solar cells generally suffer from losses in the emitter region 5. For optimum performance the doping level in the emitter region 5 should be at a low level for optimised photon collection and conversion whereas the regions 6 should be doped strongly and deeply to give good ohmic contact to the metallisation pattern 4 without shunting the buried junction 8 (see FIGS. 2, 3). Total system cost may be optimised by selecting the best combination of low manufacturing cost with device losses.

Figure 2:
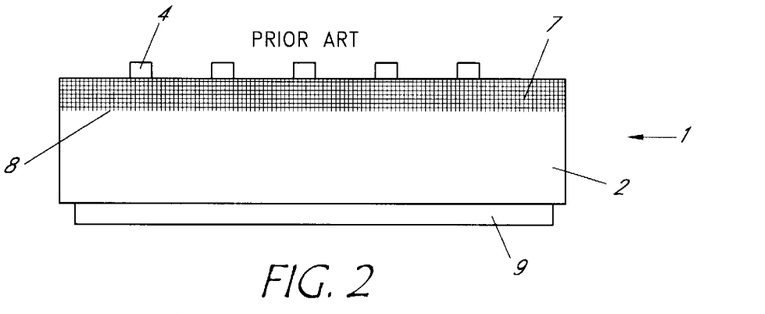
FIG. 2 shows a schematic cross-section of a known solar cell with a homogeneous emitter/collector structure.

A homogenous emitter/collector design for a solar cell as shown schematically in cross-section in FIG. 2 having front metal contacts 4 back metal contacts 9, a diffusion region 7 and a junction 8. The same diffusion region 7 over the whole front side combined with a low-cost metallisation technique such as screen printing of front metal contacts 4 leads to considerable efficiency losses. This is because the diffusion profile of diffusion region 7 (dopant surface concentration and emitter/collector depth from the surface to the junction 8) required to form good ohmic contacts with this metallisation technique is not ideal for the conversion of light to electrical energy in the intermediate emitter/collector regions 5.

A typical homogenous emitter/collector process sequence usually incorporates a structuring and chemical preparation of the wafer surfaces, a diffusion step (in-diffusion of a dopant from the surface/s), an optional oxide passivation step, an optional anti-reflective coating step (e.g. $TiO_2$ or $Si_3N_4$) which may provide additional passivation and a metallisation sequence (preferably by screen printing).

Figure 3:
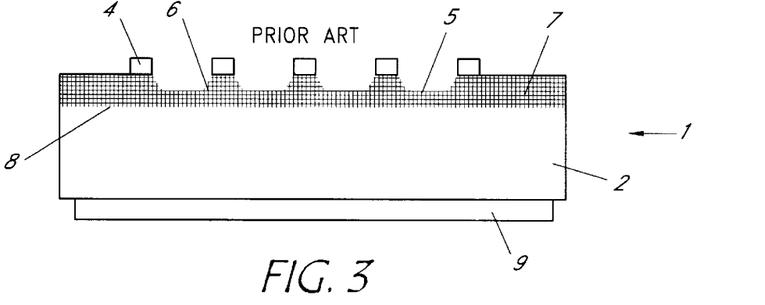
FIG. 3 shows a schematic cross-section of a known solar cell with a selective emitter/collector structure.

An improvement is shown in FIG. 3 in which the regions 5 are etched to a depth such that the selective emitter/collector regions are formed. The depth of the doped layer between the emitter/collector fingers 4 is reduced and hence, the doping level is reduced. Such devices are described in the article "Simple integral screenprinting process for selective emitter polycrystalline silicon solar cells", by Szlufcik et al., Appl. Phys. Lett. Vol. 59, Issue 13, pp 1583–1584, 1991 and in DE 44 01 782 in which the diffusion areas between the emitters are partially etched after the metal contacts have been protected by a protection layer. Application of the protection layer, typically a polymer paste requires an extra masking step. This latter technique has the disadvantages of an extra masking and a difficult etching step which increase the complexity and cost of manufacture.

Figure 4:
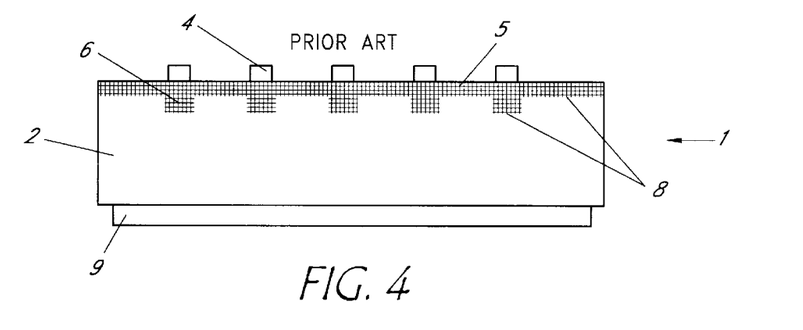
FIG. 4 shows a schematic cross-section of a further known solar cell with a selective emitter/collector structure.

FIG. 4 shows schematically in cross-section the more effective solution of a selective emitter/collector which has deep emitter/collector doping profile regions 6 with a high dopant surface concentration under the front metal contacts 3 and a shallow doping profile that is optimised for carrier collection in adjacent areas 5. However, the selective emitter/collector structure requires a more complicated manufacturing process as described, for instance, in DE 42 17 428 in which a shallow emitter layer is diffused over the whole front surface of the substrate followed by the formation of passivation/oxide layers. Openings are then formed in the oxide layers using a laser beam and the oxide layers used as a mask for a deep diffusion step of the emitter contact areas. The metal contacts 3, 4 are then formed in the trenches opened by the laser.

Known manufacturing methods of a selective emitter/collector using low cost metallisation techniques such as screen printing require a second diffusion step and/or masking and/or etching steps resulting in the need for alignment of the metallisation pattern 3 with the higher doped regions 6 on the front side of the semiconductor device 1.

General methods of making photovoltaic devices are described in "Physics, technology and use of Photovoltaics" by R. J. Overstraeten and R. P. Mertens, Adam Higler Ltd., 1986 which is incorporated herein by reference.

SUMMARY OF THE INVENTION

The semiconductor device in accordance with the present invention is defined in claims 1 to 13.

The present invention applies primarily to the formation of two different, selectively diffused regions on semiconductor substrates with different doping levels. The advantageous design of a selective emitter or collector structure is realised without any additional process step or complication of the process in comparison with homogeneous emitter/collector structures. The most favourable process sequence makes use of screen printing a solids based dopant paste to form the diffusion regions by a first high temperature heat treatment step and screen printing a metal paste to provide the metallisation by a second high temperature heat treatment step.

The selective emitter or collector process in accordance with the present invention, for example for a photovoltaic device, may have the same number of process steps as a typical homogenous emitter/collector process and less steps than for a conventional selective emitter/collector process. The method of the present invention provides a simple and economical manufacturing method for photovoltaic devices which have advantageous results over known homogeneous emitter/collector structures. Less dopant source material is required as compared with the homogeneous emitter/collector process, thus reducing the production cost while improving the final cell performance.

The present invention is a simplification of known selective emitter or collector formation process sequences. The selective emitter or collector structure in accordance with the present invention is formed within only one diffusion step. No additional masking and/or etching process steps are needed to form the selective emitter or collector.

DESCRIPTION OF THE ILLUSTRATIVE EMBODIMENTS

In the following the invention will be described with reference to certain specific embodiments and with reference to the drawings but the invention is not limited thereto but only by the claims. In the drawings some of the dimensions, for instance the thickness of layers, may have been exaggerated for purposes of clarity. In particular, the invention will be explained with reference to a photovoltaic device, sometimes called a solar cell, but the invention is not limited thereto but may find application in semiconductor devices generally. Further, the invention will mainly be described with reference to the formation of differentiated n++- and n+-type regions in a p-type substrate. The invention is not limited thereto. The methods of the present invention may be applied to the formation of differentiated p-type regions in an n-type substrate or the formation of n++-and n+-type regions in an undoped or n-type substrate or p++- and p+-type regions in an undoped or p-type substrate. Further, the invention will mainly be described with reference to a monofacial solar cell but the invention may be applied equally well to a bifacial solar cell.

The use of the simple process in accordance with the present invention to form for instance an emitter or a collector with differently doped regions with only one high temperature step and without using etching or masking techniques is not limited to solar cells. The technique can be used in other micro-electronic production processes as long as there are similar tolerances in the lateral size of doped regions and metal contacts and the diffusion profiles. Photodetectors and microengineered sensors of all types, heat conversion semiconductor devices as well as semiconductor devices of all types such as thyristors are other devices where a reduction of the production cost may be achieved by using the method in accordance with the present invention.

FIGS. 5 to 10 show schematically a selective emitter or collector manufacturing process in accordance with the present invention as applied to a solar cell 1. In a low-cost production process in accordance with the present invention, the processing may start with an as-cut semiconductor substrate 2, The substrate 2 may be single crystalline, polycrystalline or amorphous silicon. The quality of the substrate may be less than required for transistor devices, for instance solar grade silicon as disclosed in "Solar cells" 1992, by Martin Green, University of New South Wales. No limits are expected with respect to the size of substrate 2, and the size will depend upon commercially available materials. At the present time 10 cm×10 cm silicon substrates with a thickness of 200 to 400 micron are used but the invention is not limited thereto. The substrate 2 in accordance with the present invention is preferably silicon but the invention is not limited thereto. The substrate 2 may be GaAs or any other similar semiconductor substrate 2 which requires adjacent diffused doped regions with a selective difference in doping levels.

Initially the semiconductor substrate 2 is chemically cleaned and the substrate 2 is subsequently etched to remove the saw damage from the surface, for instance with a 40% by weight of NaOH in deionised water (DI water) solution at 80° C. for 2–4 minutes. The substrate may then be rinsed in DI water up to 8 MOhmcm. Optionally, a texture, e.g. pyramidal structures, may be provided mechanically or chemically on one or both major surfaces of the substrate 2 as described for instance in the article "Texturization methods for multicrystalline silicon solar cells", by Willeke and Fath, Proc. 13th European Photovoltaic Solar Energy Conf. and Exhibition, France, Oct. 23–27, 1995. For example, a suitable etch for this purpose includes a solution of 1.3 wt % NaOH and 5% isopropyl alcohol by volume in DI water at 90° C. for 10 minutes. After etching the substrate 2 is chemically cleaned and rinsed in DI water as before. In the drawings the texturizing has been omitted for clarity reasons.

Figure 5:
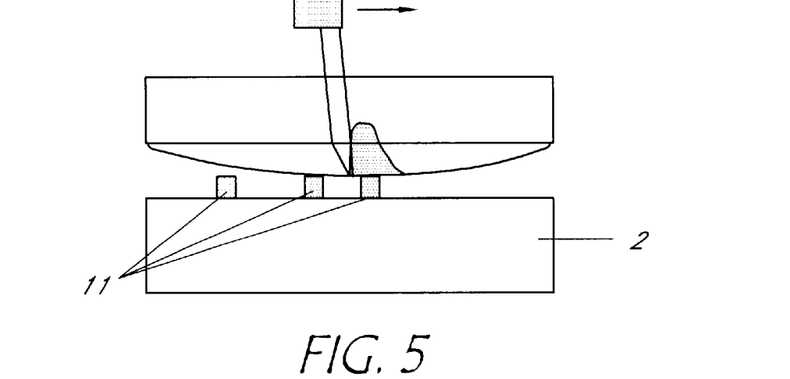
FIGS. 5 to 10 show schematic steps in the manufacture of a semiconductor device in accordance with an embodiment of the present invention.
Figure 6:
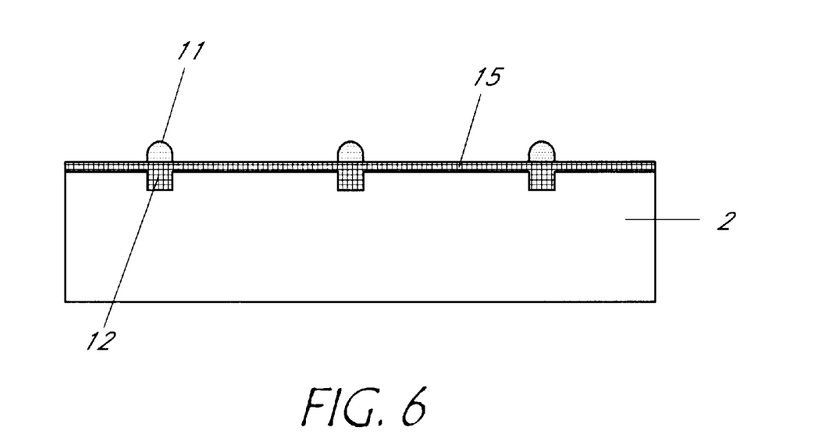

In accordance with the present invention, heavily doped deep diffusion regions 12 are to be formed under the front surface metal contact regions 20 (FIGS. 8 and 9) and a shallow weakly doped emitter or collector region 15 is to be formed elsewhere (FIG. 6). As shown schematically in FIG. 5, a solids based dopant source 11 containing a suitable dopant in the form of a paste or similar is selectively applied at least to one major surface of substrate 2 in a defined pattern which may take the form of lines and/or areas. The paste 11 is selectively applied to those regions of the substrate surface where deep diffusion regions 12 are to be formed in a later step. Various techniques may be used to apply the dopant paste 11 selectively to the substrate 2. Application of the dopant paste 11 is preferably carried out in a very defined and reproducible way. Preferred techniques have good repeatability such as screen printing, offset, gravure, ink jet printing or paste writing. The paste 11 is preferably printed onto the substrate by thick film techniques such as screen printing in order to give good repeatability in a high volume production process. As the front surface metallisation pattern 20 (FIGS. 8 and 9) has to be applied later to the substrate 2 in alignment with the deep regions 12 where the dopant paste 11 was applied previously, it is quite advantageous to use the same technique for applying both dopant paste 11 and front side metal paste 18. The good repeatability of screen printing allows subsequent application of a metal paste 18 to form a front surface metallisation pattern 20 (FIG. 8) using the same technique and using the same type of screens as used for applying paste 11 (FIG. 5). A DEK model 1760RS screen printer may be used to apply the paste 11.

Pastes 11 containing dopant sources such as P, B, As, etc. can be used depending on the conductivity type and chemical nature of substrate 2. Where the substrate 2 is silicon and has a p-type conductivity, the paste may be a phosphorous containing paste 11 as described in EP- 0 108 065 or a commercially available paste such as P101 from Soltech NV, Belgium. Alternatively, when the substrate 2 is silicon and has an n-type conductivity, the paste 11 may contain boron or aluminium. The preferred low cost solar cell manufacturing process in accordance with the present invention utilises a p-type crystalline Si substrate 2 and phosphorous as a dopant source to form an n-type emitter 12, 15 on the front side.

The viscosity of the paste 11 should be selected so that it may be applied accurately by the appropriate technique, e.g. screen printing, but does not flow or spread significantly on the substrate 2. The paste 11 is preferably thixotropic. The viscosity of the dopant paste 11 is preferably high enough to prevent significant lateral flow before or during drying or during the heat treatment step that would lead to significantly wider lines or areas of applied dopant paste 11 than the width of the front surface metal contacts 20 applied later. However, a small lateral widening of the lines or areas of paste 11 beyond the intended lines or areas which will subsequently be covered by the metal contacts 20 may be desirable to avoid shunting the junction 8 with the metal contacts 20. The application of the subsequent metal contacts 20 is performed to within a certain tolerance and it is preferable if the paste lines and areas 11 are slightly larger than the subsequent metal contact areas and lines 20 so that the alignment of the metal paste lines and areas 18 with the deep doped regions 12 may be carried out repeatably and accurately.

Preferably, the paste 11 is dried immediately after application. The patterned substrate 2 is preferably loaded as quickly as possible into a drying oven in which the viscous paste 11 is dried at temperatures between 150–350° C., preferably between 150 and 200° C., for about 1 to 10 minutes to fix its position on the substrate 2. For drying a Tempress conveyor belt dryer, a DEK infrared belt dryer or similar may be used. After drying the paste the substrate 2 is preferably subjected to a two phase heat treatment step The substrate 2 with the dried paste is loaded directly into a diffusion oven such as a Tempress/Lindberg conveyor belt diffusion furnace, e.g. from Gemco in the Netherlands. In a first phase the temperature is raised at about 100–150° C. per minute up to a about 600° C. and the remaining organic components from the dopant paste 11 are burned out, preferably in an air or oxygen atmosphere.

In a second phase, the dopant is driven at high temperature from the paste 11 directly into the substrate 2. This second heat treatment phase is preferably carried out in an inert gas atmosphere. A deep doped region 12 is formed in this high temperature step as shown schematically in FIG. 6, in which the dopant from the dopant paste 11 is diffused directly into the substrate 2 immediately below the paste areas and lines 11. At the same time, a shallow region 15 is formed by indirect diffusion from the dopant 11 into the surrounding atmosphere and from there into the exposed areas of the substrate 2.

Figure 11:
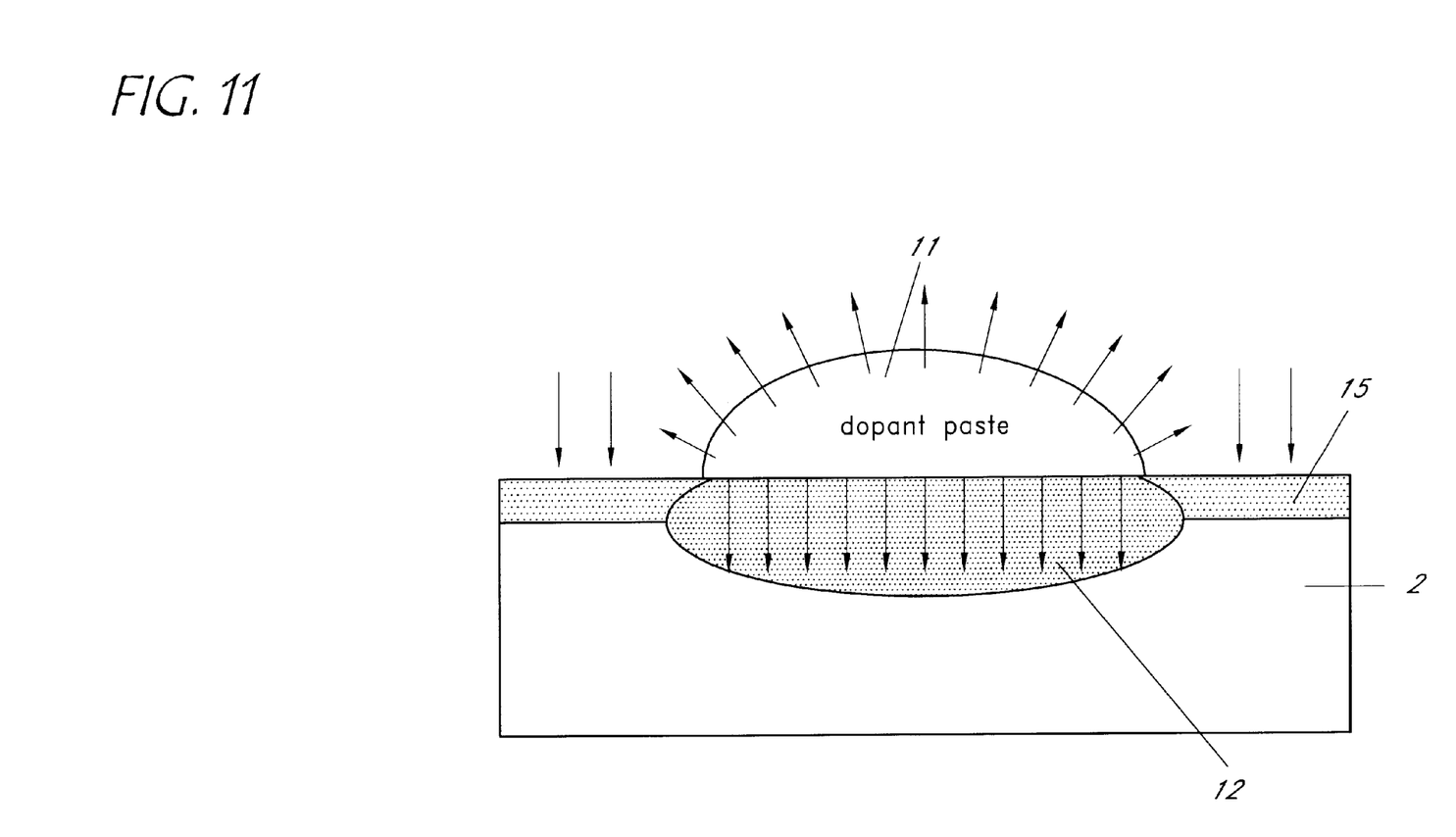
FIG. 11 shows schematically the direct and indirect diffusion process in accordance with the present invention.

Preferably, the patterned substrate 2 is placed on a horizontal movable belt in a continuous oven, for example a Tempress/Lindberg conveyor belt diffusion furnace mentioned above, and maintained in an inert gas atmosphere such as nitrogen. The temperature is raised to 800 to 1100° C., preferably 900 to 950° C., while keeping a temperature gradient at about 150° C./minute. The substrate 2 is preferably maintained at this temperature for about 10 to 60 minutes. There is not only an in-diffusion of the dopant from the paste 11 into the substrate 2 at the places where the paste 11 is in intimate contact with the substrate 2 but there is also an out-diffusion of the dopant into the surrounding atmosphere from where the dopant atoms can re-enter the substrate 2 indirectly. The indirect diffusion forms second diffusion regions 15 at places neighbouring the regions where the dopant paste 11 is applied. As shown schematically in FIG. 11, the dopant atoms start to diffuse out of the paste 11 in all directions. Thus the underlying semiconductor substrate 2 experiences a relatively strong in-diffusion of dopant atoms at the regions 12 where the paste 11 is in direct contact with it as compared to the other regions of the substrate surface. The dopant diffuses from the ambient atmosphere into the substrate 2 at those places where no dopant paste 11 was selectively applied. The indirect doping may produce a second diffusion layer 15 in the substrate 2 having a lower concentration than that of the first diffusion regions 12 of the substrate 2 immediately below where the paste 11 was applied. The low concentration of dopant atoms in the atmosphere surrounding the substrate 2 during the high temperature step may also lead to shallower second diffusion regions 15 compared with the first diffusion regions 12. The concentration of dopant atoms in the surrounding gas atmosphere can be much lower than in the paste 11 itself and consequently the diffusion rate is much lower. This results in a relatively deeply doped region 12 where the dopant source 11 is in contact with the substrate 2 and in weaker and shallower doped regions 15 at the substrate-gas interface. The differences in the two diffusion regions can be selectively controlled by changing the dopant paste composition, the atmosphere, the diffusion time or the diffusion temperature. The conditions may be optimised to produce a shallow second diffusion region 15 while the first diffusion region 12 should be just deep enough to allow formation of good ohmic front surface metal contacts 20 without shunting the junction 8. It is also possible to execute the diffusion sequence using a gaseous dopant atmosphere, as for instance $POCl_3$, $BBr3$ etc. in a closed tube furnace. By adjusting the relative amount of direct diffusion from the gaseous dopant gas and indirect diffusion from the dopant paste 11 to the second diffusion region 15 it is possible to manipulate the diffusion profiles of the first and second diffusion regions 12, 15 selectively and independently. Further, more than one paste 11 may be used to form selectively, by heat treatment, different regions in the substrate 2. The different pastes 11 may have different concentrations of dopant atoms or may contain different types of dopant. Further, some of the paste 11 may contain no dopant atoms and may be merely used as a mask to prevent indirect doping of the underlying layer of the substrate 2.

Where the semiconductor device 1 is a photovoltaic cell, variations in the depth or dopant concentration of the deep first diffusion regions 12 which form part of the emitter or collector regions may not influence the cell performance strongly whereas variations in the shallow second diffusion regions 15 may have a much bigger impact on cell characteristics. The second diffusion region 15 normally has a much lower surface dopant concentration and depth than the deep regions 12. The doping conditions for the second diffusion region 15 are preferably optimised for carrier collection. Carrier collection is sensitive to dopant concentration and depth. On the other hand, the diffusion in the first diffusion region 12, at those places where the diffusion paste 12 has been applied and where the metallisation pattern 18 will be printed later in the process sequence, has to be only deep enough and have a high enough surface dopant concentration so that good ohmic contacts 20 can be formed with the emitter or collector region 12 without shunting the junction 8.

Figure 12:
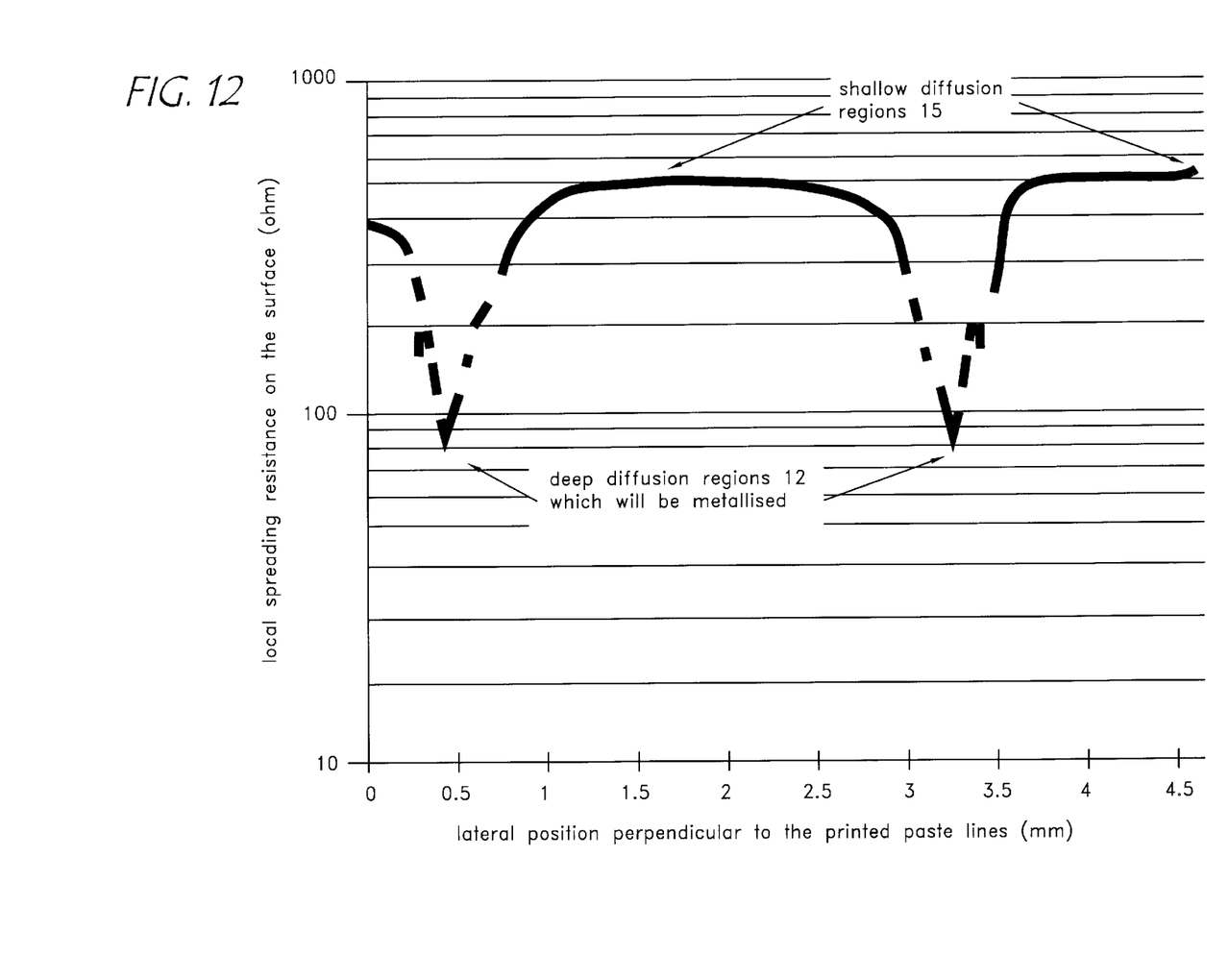
FIG. 12 shows a plot of the lateral spreading resistance of a semiconductor device in accordance with the present invention.

In accordance with the method of the present invention differentiated deep and shallow doped regions 12, 15 may be produced in a single doping step. Surface dopant concentrations may be, for example, in the range typically above $10^{20}$ phosphorus atoms/cm³ for the deeper doped regions 12 and in the range $5\times10^{18}$ to $10^{20}$, typically $1\times10^{19}$ to $5\times10^{19}$ phosphorus atoms/cm³ for the shallower doped regions 15. Junction depths for the deeper doped regions 12 are preferably at least 0.3 micron, more preferably at least 0.5 micron and typically 0.6 micron and for the shallower doped regions 15 up to 0.3 micron, typically 0.2 micron. FIG. 12 shows a lateral spreading resistance scan of a selective emitter or collector structure produced for a solar cell in accordance with the present invention carried out in accordance with the article "Spreading resistance measurements—An overview", by J. R. Ehrstein, D. C. Gupta, and P. H. Langer, Emerging Semiconductor Technology, ASTM STP 960, Am. Soc. for Test. and Mat. 1986. Paste lines 11 of a width of 100 micron were spaced at a distance of about 3 mm from each other. The selective emitter or collector structure has low resistance, deeply and strongly diffused regions 12 where the metallisation 20 has to be applied and shallow and weak diffusion regions 15 in the emitter or collector region where photons are absorbed and create carriers. As can be seen from FIG. 12, the paste has resulted in low resistance regions 12 over a narrow distance about the size of their own width. The resistance decreases monotonically towards the shallow regions 15 over a distance of about 1 mm. The resistance ratio of the deep and shallow regions 12, 15 is above 5 and is about 10 or more for a solar cell. This is caused by a similar variation in the dopant atom concentration in these areas. In a complete device, the deeply diffused regions 12 and the shallow diffused regions 15 would alternate periodically showing a steep gradient at the transition regions where there is roughly one order of magnitude difference in the surface concentration of dopant atoms. The higher the dopant concentration the lower the electrical resistance. The monotonic decrease in dopant concentration and associated electrical resistance from the weakly doped regions 15 towards the deeply diffused regions 12 where the metal contacts 20 will be placed in a finished solar cell provides excellent carrier collection properties. The increasing gradient in the surface concentration of dopant atoms towards the regions where the metal contacts will be placed in the finished solar cell facilitates the carrier transport towards these collecting contacts 20. In accordance with the present invention a monotonic increase of dopant atom concentration may be obtained in the surface region of the substrate 2 between the shallow regions 15 and the deep regions 12 with at least a fivefold, and typically an order of magnitude or more, difference between the dopant density in the shallow regions 15 and the dopant density in the deep regions 12. It is possible to produce solar cells with the processing sequence of this invention with up to >1% absolute higher efficiencies as compared to solar cells produced by a homogeneous emitter or collector process without adding any process step and while reducing the cost (dopant source) of the diffusion sequence.

After the diffusion step the remaining diffusion glass on the silicon substrate surface may be removed in an chemical etching solution of about 25%–50% HF in DI water and the substrate 2 is cleaned and rinsed afterwards. The present invention includes that the diffusion glass is optionally not removed and the process continues to an oxidation/passivation step. This may avoid an HF acid cleaning step which is an advantage environmentally.

Figure 7:
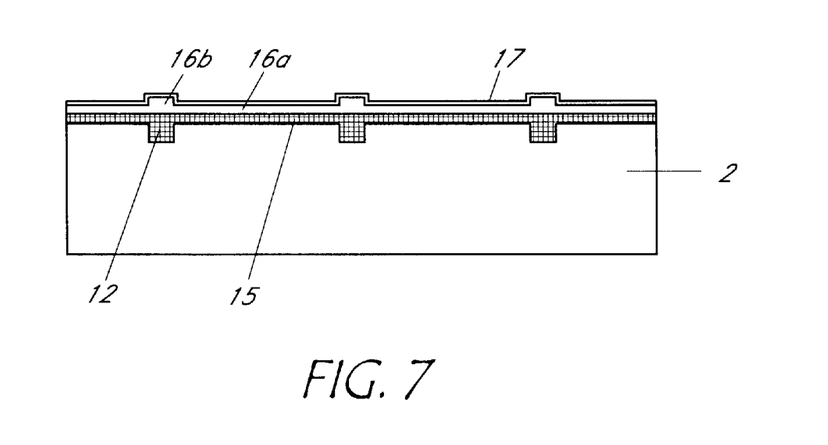

As shown schematically in FIG. 7, the diffusion sequence may be followed by an optional oxidation step where an $SiO_2$ layer 16a and 16b is formed on the surfaces of the substrate by exposing the substrates to an $O_2$ atmosphere, typically in a quartz boat, for 1–20 minutes at temperatures ranging from 800–950 degree C. This $SiO_2$ layer 16a, 16b serves to passivate defects in the surface emitter/collector region 15 of the substrate 2 which could decrease the solar cell performance. Passivation using an oxide layer reduces the surface recombination velocity which reduces the loss of carriers, hence improving efficiency. Optionally, not only a passivating layer 16a, 16b such as an oxide may be applied but also an anti-reflection coating layer (ARC) 17. The ARC layer 17 may be applied by chemical vapour deposition (CVD, e.g. a $TiO_2$ layer) or plasma enhanced CVD (PECVD, e.g. a silicon nitride layer) or similar techniques. The application of the ARC layer can result in excellent passivation of the surface and bulk of the semiconductor substrate.

Figure 8:
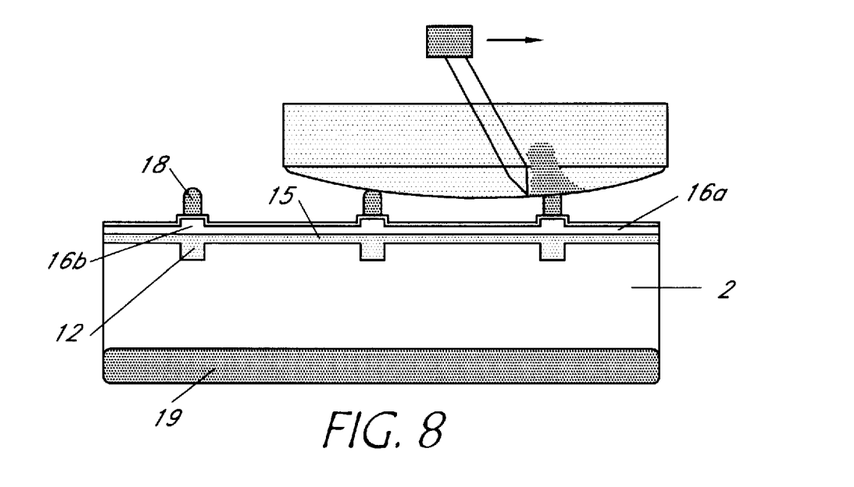
Figure 9:
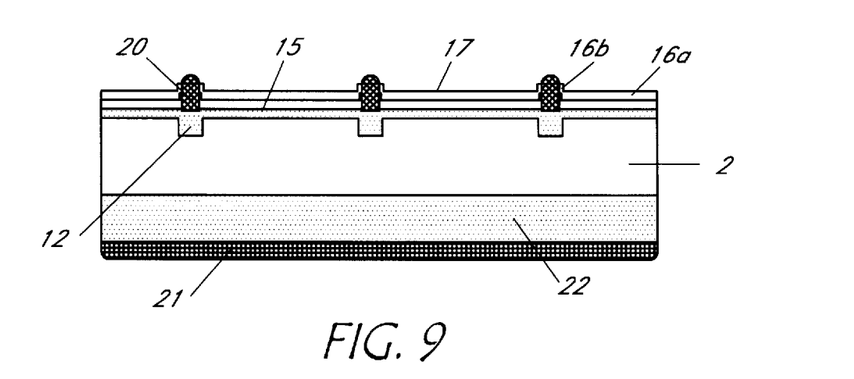

Finally the metallisation sequence comprises usually two or three contact printing steps: front contact 20 and one or two back contact patterns 21 depending on how many different metals are used. As shown schematically in FIG. 8, metal paste 18 is selectively applied to the front side of the substrate 2 in alignment with regions 12 that are heavily doped. A further metal paste 19 is applied either selectively or non-selectively to the backside of the substrate 2. Screen printing and subsequent drying is the most preferred way to apply these contacts, however other thick film techniques mentioned above or evaporation or metal plating from an aqueous solution may be used instead. Each printing step is followed by a drying step at moderate temperatures around 250 degree C., e.g. by infra-red heaters. As shown in FIG. 9, the metal pastes 18, 19 are then sintered at high temperatures ranging from 650 to 900 degree C. for typically about 30 to 200 seconds to form good ohmic contacts 20 on the front side of the substrate 2 without shunting the junction 8, as well as good ohmic contacts 21 on the back side of substrate 2. The contacts 20 and 21 are formed through any ARC or oxide layer 16b; 17. The peak temperature and temperature profile (temperature versus time) are very important and have to be adapted for each metallisation paste and process sequence separately. Typically the front side and back side contacts screen-printed with metal paste 18, 19 are both sintered together in one high temperature step after having been dried separately. Optionally, a back surface field (BSF) layer 22 is formed at the same time on the back side of substrate 2 as shown schematically in FIG. 9. To form a BSF 22 it is preferred if a high temperature and aluminium paste are used for the formation of back surface metal contacts 21.

Figure 10:
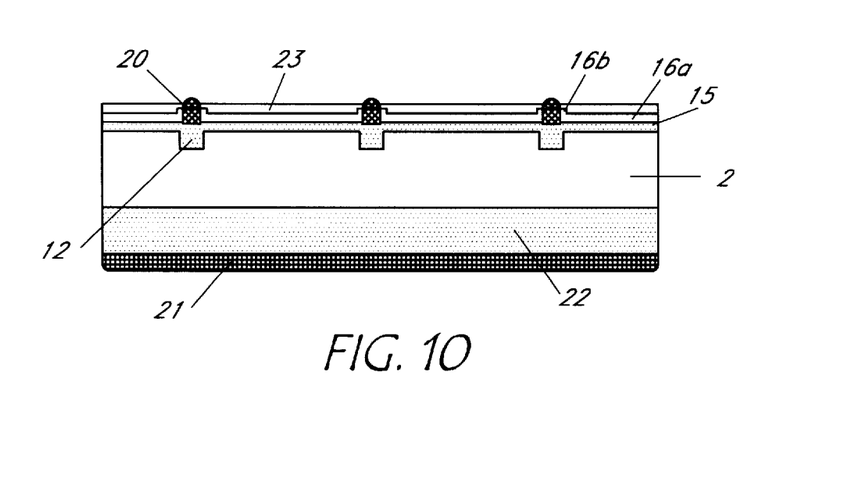

Optionally, as shown schematically in FIG. 10, an anti-reflection coating (ARC) layer 23 can be applied after metallisation rather than the ARC layer 17 applied before metallisation and described with reference to FIG. 8. Typical ARC layers may include TiO2, $Si_3N_4$, or $Ta_2O_5$, or similar materials and can be applied by various techniques. Metal contact sintering temperatures as high as 800° C. can be used for the contact formation without shunting the junction 8. Where aluminium is used for the metal contacts, sintering at such high temperatures has additional advantages as for instance Al gettering and BSF formation.

Thick film techniques for applying the metal and/or doping pastes such as screen printing show an excellent repeatability. The substrates 2 may be loaded each time by the screen printer into the same position under the screen by means of a CCD camera controlled positioning system. Alignment of metallisation and diffusion patterns can be controlled if oxide and/or ARC layers 16a, 16b; 17, 23 have been applied by utilising the different colour of the slightly wider first diffusion regions 12 under the microscope. With deposition of an ARC layer 17, 23, the substrate 2 shows a different colour at those places where the substrate has higher dopant surface concentrations. This is because the underlying oxide layer 16b grows thicker at places with higher dopant surface concentration compared with the oxide layer 16a over the areas 15 of lower doping level. As long as the anti-reflective coating (ARC) layer 17 or 23 is applied, the underlying pattern will be visible. The reason for this is a faster oxidation at places with higher dopant surface concentration, resulting in a thicker oxide layer 16. After applying an ARC layer 17 or 23 this difference in oxide thickness becomes visible as a difference in optical thickness and therefor colour of the layers 16b+17 or 23 compared to 16a+17 or 23.

It is possible to form with the simple process sequence according to the present invention selective emitter/collector solar cells with improved cell performance (collection efficiency) without complicating the process or increasing the production cost. The result is a more cost-effective production of solar cells. No additional or complicated processing equipment is needed where screen printed diffusion was already used. At the same time the process tolerance may be increased by using a selective emitter. Variation in different process parameters as for instance in the metallisation sintering step is less critical than in a homogenous emitter or collector process. This results in a higher process yield which makes the process more cost-effective.

FIGS. 13 to 16 show schematically the manufacturing steps of a semiconductor device 30 in accordance with a further embodiment of the present invention. As one embodiment of the present invention has been described in some detail with reference to FIGS. 5 to 10, the description of the further embodiment will not be made in detail. The formation of passivation layers, cleaning steps and other details of the process other than the main doping steps will not be described. The process of the further embodiment is suitable for forming a photovoltaic device.

Figure 13:
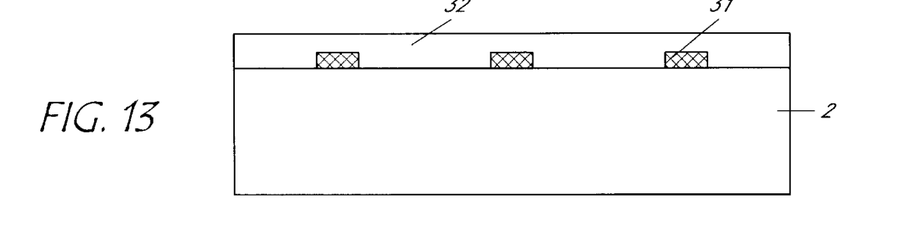
FIGS. 13 to 16 show schematic steps in the manufacture of a semiconductor device in accordance with a further embodiment of the present invention.

As shown in FIG. 13, a first doped paste pattern 31 is applied selectively to a semiconductor substrate 2 which may be a silicon substrate and may be undoped or may be p-type or n-type conductivity. The paste 31 may be applied by any of the thick-film techniques described previously. The paste pattern 31 is then dried. The first dopant paste 31 may have either the first or second conductivity. The first paste pattern 31 is optionally protected by applying a layer of another material, e.g. a further paste 32. Paste 32 may have a different concentration or type compared with paste 31 or may be undoped. Paste 32 may be applied over a major surface of substrate 2. The paste layer 32 is then dried.

Figure 14:
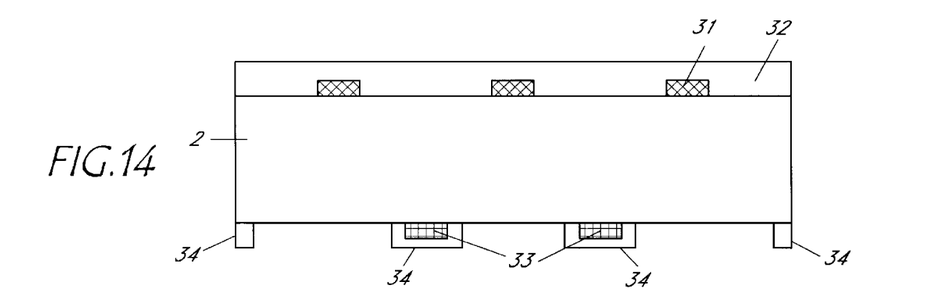

As shown in FIG. 14, a third paste pattern 33 is optionally applied selectively to a further major surface of the substrate 2. Paste pattern in then dried. Paste 33 may have either the first or second conductivity. Paste pattern 33 and other selected parts of the surface of substrate 2 may be protected by the selective application of an undoped material 34, which may be a paste. The paste 34 may be applied by any of the thick-film techniques mentioned above. Paste pattern 34 is then dried.

Figure 15:
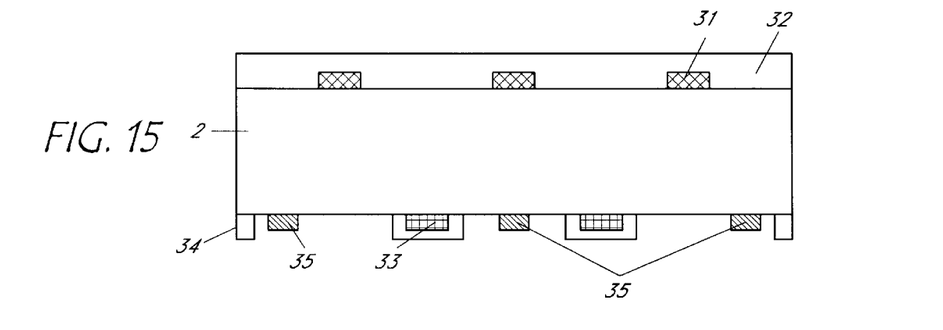
Figure 16:
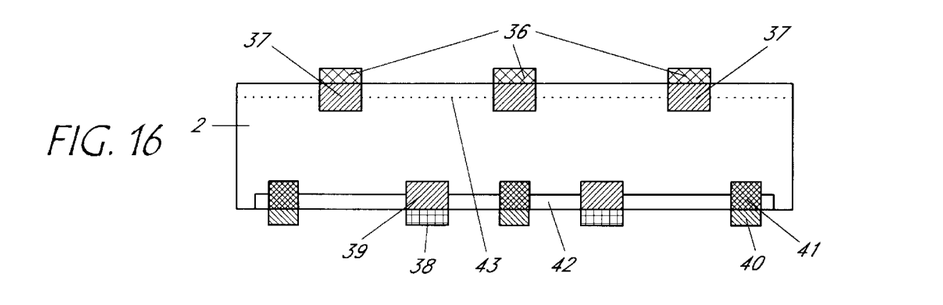

As shown in FIG. 15, another doped paste pattern 35 may be applied selectively to a major surface of the substrate 2. Paste 35 may include dopant of either conductivity type. Paste 35 may be applied by any of the thick-film techniques mentioned above. Paste pattern 35 is then dried.

The patterned substrate 2 is then placed in a furnace and the dopants from those pastes containing dopant atoms, e.g. 31, 33, 35, are driven into the substrate 2 to form doped layers 37, 39 and 41, respectively. At the same time the dopant atoms from the non-protected pastes diffuse indirectly into regions 42 of the substrate which are not protected to form shallow weakly doped regions 42. Finally, metal pastes are applied in alignment with the regions 37, 39 and optionally 41 and sintered at high temperature to form metal contacts 36, 38, and optionally 40, respectively.

In the process of the further embodiment, substrate 2 may be p-type silicon, pastes 31, 35 and optionally 32 may be phosphorous containing pastes, paste 33 may be a boron or aluminium containing paste and paste 34 may be undoped. When layer 32 includes a dopant, the high temperature drive-in step leads to doped regions 43 between the highly doped reions 37 on the first major surface of the semiconductor substrate (inducated in FIG. 16 by a dotted line). Alternatively, protective paste 32 in FIGS. 13 and 14 may be omitted leading to indirectly diffused weakly doped regions 43 between highly doped regions 37 (indicated by a dotted line in FIG. 16) after the drive-in step. As a further modification, the layers 32 and 31 may be omitted in FIG. 14 resulting in an indirectly diffused layer 43 accross all of the first major surface of the semiconductor substrate (indicated in FIG. 16 by a dotted line) leading to a floating junction after the drive-in step.

The device produced with a single diffusion step in accordance with the further embodiment of the present invention may be a solar cell having a selective emitter on the top side and a floating junction on the back side. Such a photovoltaic device may show a better cell performance than a monofacial cell with a conventional back side metallisation over the whole back surface. The device produced by the method of the further embodiment may be used in addition as a bifacial solar cell.

The process in accordance with the further embodiment has the advantage that solar cells can be produced having improved efficiency values and short circuit currents resulting from a more ideal emitter/collector structure and a more ideal back contact. The back contact in accordance with the further embodiment does not have metallisation over the whole of the back major surface of the substrate 2 resulting in better back surface reflection or to its use in bifacial cells designs.

While preferred embodiments of this invention have been described in detail above, it is to be understood that many changes and modifications may be made by those skilled in the art without departing from the scope and spirit of this invention.

What is claimed is:

1. A semiconductor device comprising:
a semiconducting substrate in the shape of a slice, a first and a second doped region in one major surface of the semiconductor substrate, the first doping region having a higher surface dopant concentration than the second doped region; and a metal contact pattern substantially in alignment with said first doped region, wherein the surface dopant concentration of said second doped region increases with distance from within said second doped region towards said first doped region the increasing gradient in the surface concentration of the dopant facilitating carrier transport towards the metal contact pattern substantially along the length of the second doped region.

2. A semiconductor device according to claim 1, wherein the increase of surface dopant concentration is monotonic.

3. The semiconductor device according to claim 1, wherein the increase of surface dopant concentration is over a distance of about 1 mm.

4. The semiconductor device according to claim 1, wherein said substrate is of the first conductivity type and the dopant of said first doped region is of a second conductivity type.

5. The semiconductor device according to claim 1, further comprising a passivating layer over said first and second doped regions.

6. The semiconductor device according to claim 5, where said passivating layer is an oxide layer.

7. The semiconductor device according to claim 1, wherein the surface of said semiconducting substrate is texturised.

8. The semiconductor device according to claim 1, further comprising an anti-reflection coating.

9. The semiconductor device according to claim 1, wherein said second doped region forms an emitter or collector region in said semiconductor substrate.

10. The semiconductor device according to claim 1, wherein the ratio of the surface dopant concentrations between first and second doped regions is at least five and preferably about 10 or more.

11. The semiconductor device according to claim 1, wherein the second doped region has a central region of substantially uniform surface dopant concentration.

12. The semiconductor device according to claim 1, wherein said metal contact pattern forms an ohmic contact with said first doped region.

13. The semiconductor device according to claim 1, wherein the first and second doped regions are formed by diffusing dopant atoms from a solids-based dopant source into said substrate by a controlled heat treatment step in a gaseous environment surrounding said semiconducting substrate, the dopant from said solids-based dopant source diffusing directly into said substrate to form the first doped region in said substrate immediately beneath said solids-based dopant source and, at the same time, said dopant from said solids-based dopant source diffusing indirectly via said gaseous environment into said substrate to form the second doped region.

* * * * *